US012693591B2

(12) United States Patent
Johnston et al.

(10) Patent No.: US 12,693,591 B2
(45) Date of Patent: Jul. 28, 2026

(54) ENHANCED MASK PATTERN-AWARE HEURISTICS FOR OPTICAL PROXIMITY CORRECTIONS FOR INTEGRATED CIRCUITS

(71) Applicant: Intel Corporation, Santa Clara, CA (US)

(72) Inventors: Timothy C. Johnston, Sacramento, CA (US); Seongtae Jeong, Portland, OR (US); Talha Khan, Hillsboro, OR (US); Anjan Raghunathan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 17/973,514

(22) Filed: Oct. 25, 2022

(65) Prior Publication Data

US 2024/0134269 A1 Apr. 25, 2024
US 2024/0231217 A9 Jul. 11, 2024

(51) Int. Cl.
  *G03F 1/36* (2012.01)
(52) U.S. Cl.
  CPC ..................................... *G03F 1/36* (2013.01)
(58) Field of Classification Search
  CPC ..... G03F 1/36; G03F 1/72; G03F 1/76; G03F 7/70441; G03F 7/70433; G06F 30/398
  USPC ..................................................... 716/112, 53
  See application file for complete search history.

(56) References Cited

U.S. PATENT DOCUMENTS

| | | | |
|---|---|---|---|
| 9,746,783 B2 | 8/2017 | Lee et al. | |
| 2003/0008215 A1* | 1/2003 | Mukherjee | G03F 7/70441 430/5 |
| 2008/0301620 A1* | 12/2008 | Ye | G03F 1/36 430/5 |
| 2014/0355884 A1* | 12/2014 | Tran | G06V 30/224 382/188 |

(Continued)

FOREIGN PATENT DOCUMENTS

| | | |
|---|---|---|
| CN | 114063380 A | 2/2022 |
| WO | 2022083977 A1 | 4/2022 |

OTHER PUBLICATIONS

Extended European Search Report mailed Mar. 15, 2024 in EP Application No. 23196630.1, 22 pages.

*Primary Examiner* — Paul Dinh
(74) *Attorney, Agent, or Firm* — Gray Ice Higdon, PLLC

(57) ABSTRACT

This disclosure describes systems, methods, and devices related to optical proximity corrections to an integrated circuit photomask. A method may include identifying a first contour of a first adjacent polygon of a photomask predicted for a first polygon of an integrated circuit, the first contour excluding a first corner formed by a first edge and a second edge of the first polygon; identifying a second contour of a second adjacent polygon of a photomask predicted for a second polygon of the integrated circuit, the second contour excluding a second corner formed by a third edge and a fourth edge of the second polygon; generating a fast contour prediction based on corner rounding associated with the first contour and the second contour; and generating, based on the fast contour prediction, a minimum distance between the first contour and the second contour, the minimum distance associated with the optical proximity corrections.

20 Claims, 6 Drawing Sheets

(56) References Cited

U.S. PATENT DOCUMENTS

2018/0341173 A1 * 11/2018 Li ............................ G03F 1/36
2021/0404826 A1 * 12/2021 Yu ......................... A63F 13/422

* cited by examiner

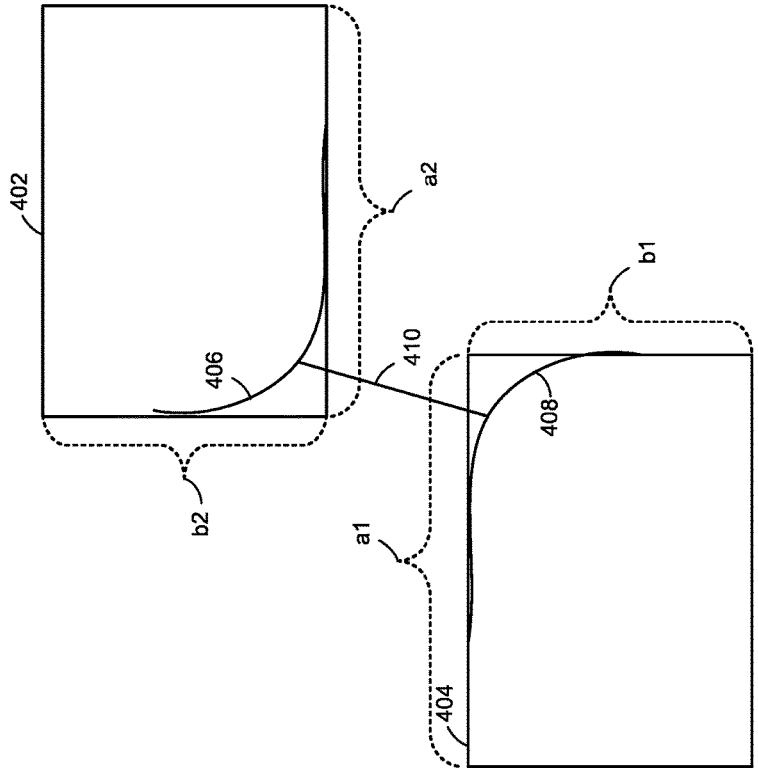
FIG. 4

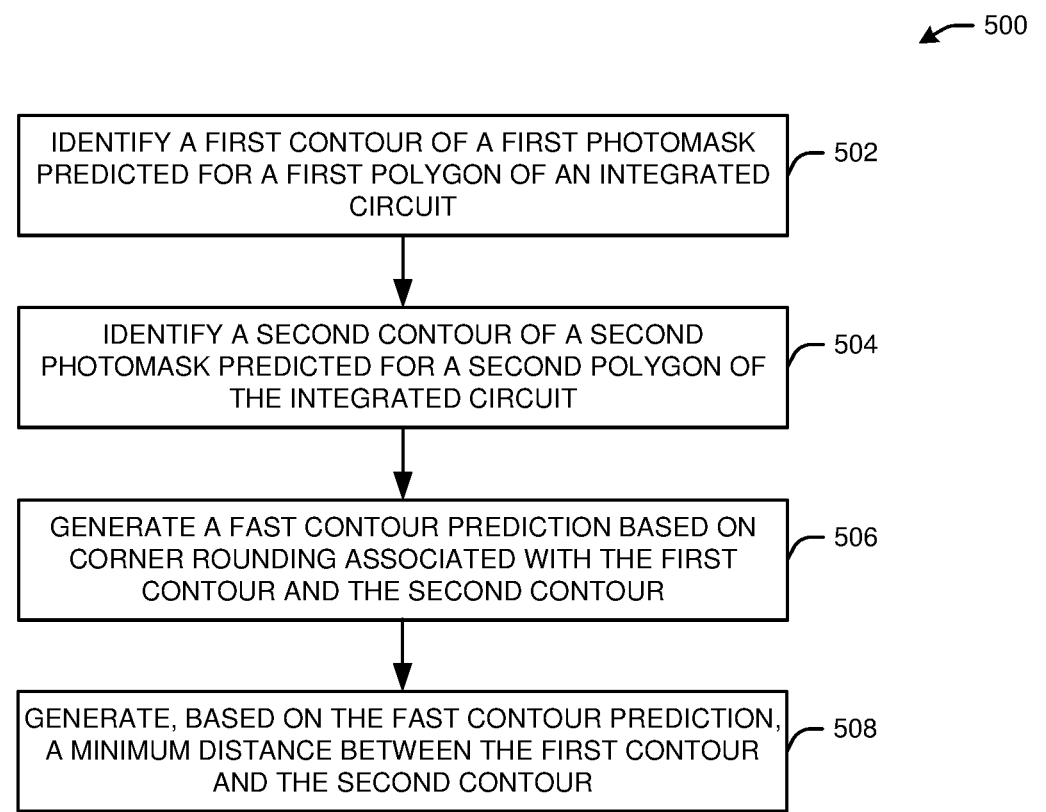

```
                                                                    ← 500

┌─────────────────────────────────────────────┐
    │  IDENTIFY A FIRST CONTOUR OF A FIRST PHOTOMASK │ ─ 502
    │  PREDICTED FOR A FIRST POLYGON OF AN INTEGRATED │
    │                  CIRCUIT                       │
    └─────────────────────────────────────────────┘
                        │
                        ▼
    ┌─────────────────────────────────────────────┐
    │    IDENTIFY A SECOND CONTOUR OF A SECOND      │ ─ 504
    │  PHOTOMASK PREDICTED FOR A SECOND POLYGON OF  │
    │            THE INTEGRATED CIRCUIT             │
    └─────────────────────────────────────────────┘
                        │
                        ▼
    ┌─────────────────────────────────────────────┐
    │  GENERATE A FAST CONTOUR PREDICTION BASED ON  │ ─ 506
    │   CORNER ROUNDING ASSOCIATED WITH THE FIRST   │
    │        CONTOUR AND THE SECOND CONTOUR         │
    └─────────────────────────────────────────────┘
                        │
                        ▼
    ┌─────────────────────────────────────────────┐
    │ GENERATE, BASED ON THE FAST CONTOUR PREDICTION,│ ─ 508
    │ A MINIMUM DISTANCE BETWEEN THE FIRST CONTOUR  │
    │          AND THE SECOND CONTOUR              │
    └─────────────────────────────────────────────┘
```

FIG. 5

ENHANCED MASK PATTERN-AWARE HEURISTICS FOR OPTICAL PROXIMITY CORRECTIONS FOR INTEGRATED CIRCUITS

TECHNICAL FIELD

This disclosure generally relates to devices, systems, and methods for optical proximity corrections for integrated circuits and, more particularly, to mask pattern-aware heuristics for optical proximity corrections for integrated circuits.

BACKGROUND

Integrated circuit manufacturing often uses a photomask as a template for a given integrated circuit design. Optical proximity corrections (OPC) may modify mask patterns to improve printability of an integrated circuit wafer. There are efforts to enable more competitive OPC for improved fab patterning in mask geometries that are in close corner-to-corner or end-to-end configurations, in which mask polygon rule-based Mask Rule Checks (MRC) have been limiting to OPC. Existing rule-based solutions may exclude a significant amount of OPC mask solution space that could still be manufacturable by the mask shop and better for the wafer fabrication.

BRIEF DESCRIPTION OF THE DRAWINGS

FIG. 4 illustrates a Bezier curve parameterization for heuristic photomask contour prediction for generating a photomask using enhanced optical proximity corrections, in accordance with one or more example embodiments of the present disclosure.

FIG. 5 illustrates a flow diagram of an illustrative process for generating a photomask using enhanced optical proximity corrections, in accordance with one or more example embodiments of the present disclosure.

DETAILED DESCRIPTION

Figure 1:
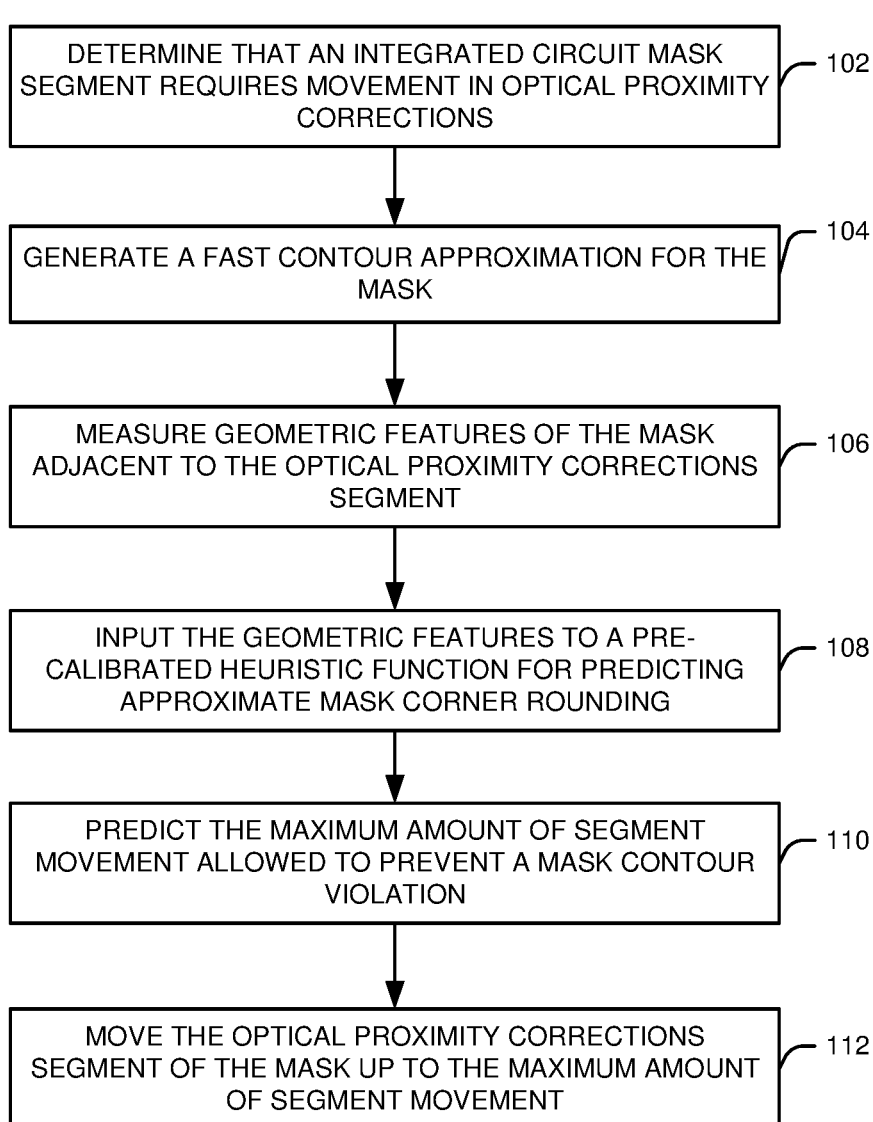
FIG. 1 is an example process for generating a photomask using enhanced optical proximity corrections, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

Integrated circuit manufacturing often uses a photomask as a template for a given integrated circuit design. Optical proximity corrections (OPC) may modify mask patterns to improve printability of an integrated circuit wafer. Rule-based Mask Rule Checks (MRC) are the current standard in OPC algorithms. Some current techniques use parametric test cases to explore the minimum polygon-based corner-to-corner that will not create mask manufacturing liabilities.

Conventional OPC MRC places restrictions on the mask solution space which are in some geometries overly conservative. In such cases, a smaller mask target critical dimension (CD) would benefit fab wafer patterning, but the OPC engine is not able to take mask corner rounding into account to enable this.

In one or more embodiments, the present disclosure provides a fast approximation for mask corner rounding that can be used in OPC correction to enable desired mask targets to reach closer to the actual manufacturing limits. The present disclosure provides for predicting final mask pattern (e.g., contour) CDs from the mask target geometry during OPC iterations. This information can be used to limit mask movement in a flexible manner to push correction right to the mask manufacturing limits. The value in the enhancements of the present disclosure is in achieving tighter mask CDs for improved fab patterning (e.g., tighter corner rounding, improved edge placement error) while meeting mask manufacturing constraints. This could lead to improved yield and a less expensive process.

In one or more embodiments, potential heuristic solutions for the "pre-calibrated heuristic function that predicts approximate mask corner rounding" are provided herein: (1) A fast heuristic mask corner rounding prediction equation based on the lengths of the four mask segments comprising a corner-to-corner geometry. The equation has been fit on a reliable mask contour model, such as is used in MPC, and approximates the closest approach ("bridge" CD) that would be expected between the predicted mask contours. Similar may equations would be needed for each mask manufacturing process. (2) A second method for fast heuristic mask corner rounding is based on creating a Bezier-curve based mask contour approximation. Such an approximation would also first be fit to a reliable MPC model over the parameter space of the geometric properties of the two segments comprising a given corner of the mask before OPC, dependent on the specific mask process to be used. Then during OPC, a Bezier curve approximation to the MPC contour bridge CD can be calculated quickly using published fast algorithms for determining the closest approach of two Bezier curves.

In one or more embodiments, in solution (1) above, Equation (1) below may be used to predict the bridge CD:

$$\text{Approx\_Bridge\_CD} = \tag{1}$$
$$\text{CR1\_Bridge} + \text{C2C\_length} + \text{CR2\_Bridge where } CR_{Bridge} =$$
$$CR * \cos(\phi), \phi = \tan^{-1}\left(\frac{(Vertex2.y - Vertex1.y)}{(Vertex2.x - Vertex1.x)}\right),$$

and C2C_length is the distance from one corner to the other corner in an integrated circuit. In this manner, the C2C (corner-to-corner) length adds the distances (e.g., CR1_Bridge, CR2_Bridge) from the respective corners to the rounded contours that do not perfectly match the corners, allowing for a fast approximation of the corner rounding distances to use during a mask design phase (OPC). The contours for a mask polygon of an integrated circuit may include mask contours with the rounded edges, so Equation (1) represents an empirical fit of the two closest edges (corners) forming a corner-to-corner geometry of the integrated circuit.

In one or more embodiments, in solution (2) above, Bezier curves may be used for the corner-to-corner approximation for a mask polygon mask for an integrated circuit. Bezier curves may refer to curves defined by a set of points to create an approximation of the rounded edge mask. A Bezier curve may represent the corners of the polygon, and the curve may include points set in a heuristic manner (e.g., using an empirical fit similar to Equation (1) above). The parameters used to set the points of the curve to represent the rounded contours may include the type of endpoint (e.g., convex or concave), and the lengths of the neighboring points, for example. Setting the points of the Bezier curve in such a manner allows for approximating the MPC model. An advantage of solution (2) is that it allows for geometries that may not fit into Equation (1), for example, geometries that may not be corner-to-corner.

In one or more embodiments, using any combination of solution (1) or (2) above, a fast contour approximation may be generated for photomask of an integrated circuit. Devices may perform measurements of geometric features of the photomask at locations adjacent to the OPC segment where the fast contour approximation is used. The geometric features may include segment length, corner convexity, and corner-to-corner distance. The geometric features may be input to a pre-calibrated heuristic function that predicts approximate mask corner rounder, and devices may predict the maximum amount of movement allowed to prevent a mask contour violation. The OPC segment of the mask may be moved up to the limit of the maximum amount of movement allowed, allowing for an optimized photomask design.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 is an example process 100 for generating a photomask using enhanced optical proximity corrections, according to some example embodiments of the present disclosure.

Figure 2:
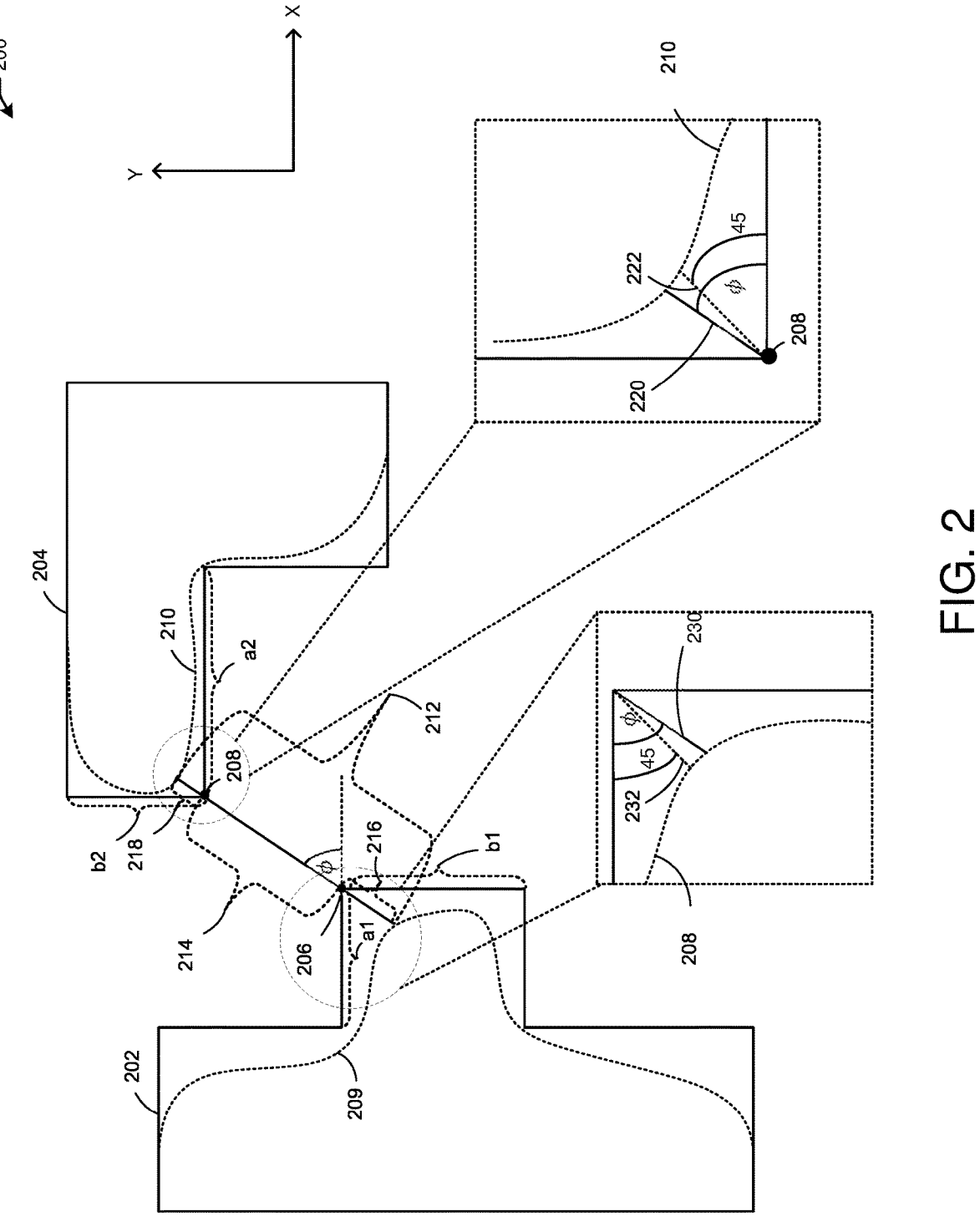
FIG. 2 illustrates example extraction of geometric parameters for heuristic photomask contour prediction for generating a photomask using enhanced optical proximity corrections, in accordance with one or more example embodiments of the present disclosure.
Figure 3:
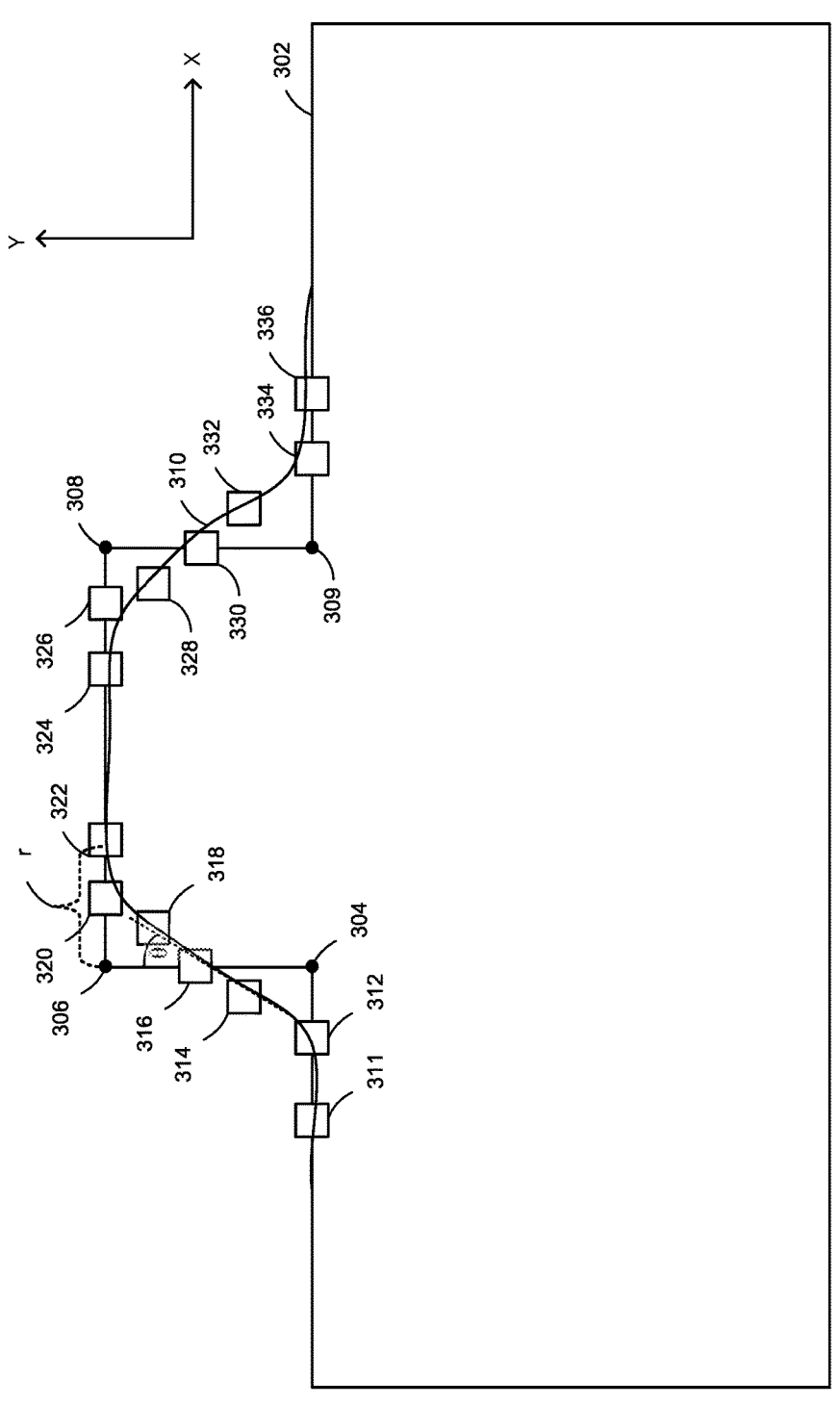
FIG. 3 illustrates a Bezier curve parameterization for heuristic photomask contour prediction for generating a photomask using enhanced optical proximity corrections, in accordance with one or more example embodiments of the present disclosure.

Referring to FIG. 1, at block 102, a device (e.g., the OPC device 619 of FIG. 1) may determine that an IC mask segment (e.g., as show in FIGS. 2-4) requires movement in OPC. For example, the device may determine that the IC mask segment is for a mask polygon with one or more corners. At block 104, the device may generate a fast contour approximation for the mask. The contour(s) used for the mask segment may not align perfectly with the polygon boundaries (e.g., as shown in FIGS. 2-4), for example, when the polygon has one or more corners. The fast contour approximation may be generated using solution (1) and/or solution (2) above, by extracting parameters as in FIG. 2, and/or by using a Bezier curve parameterization as in FIG. 3 and/or FIG. 4. At block 106, the device may measure geometric features of the mask adjacent to the OPC segment. The geometric features may include segment length, corner convexity, and corner-to-corner distance. At block 108, the device may input the geometric features to a pre-calibrated heuristic function for predicting approximate mask corner rounding. At block 110, the device may predict, using the pre-calibrated heuristic function, the maximum amount of segment movement allowed to prevent a mask contour violation (e.g., by comparing the mask segment movement to polygon rule based MRCs to determine the maximum amount that the mask segment may move within the rules). At block 112, the device may move the OPC segment of the mask up to the maximum amount to comply with MRC rules, allowing for the mask to be adjusted in OPC based on the fast contour mask approximation.

FIG. 2 illustrates example extraction 200 of geometric parameters for heuristic photomask contour prediction for generating a photomask using enhanced optical proximity corrections, in accordance with one or more example embodiments of the present disclosure.

Referring to FIG. 2, the extraction 200 may include polygon 202 and polygon 204, which may form a corner-to-corner geometry of corner 206 of the polygon 202 and corner 208 of the polygon 204. To generate the fast contour approximation of block 104 of FIG. 1, a contour 209 may represent the polygon 202, and a contour 210 may represent the polygon 204. As shown, the contour 209 may not align entirely with the polygon 202, and the contour 210 may not align entirely with the polygon 204. In particular, the contour 209 may not intersect with the corner 206, and the contour 210 may not intersect with the corner 208. The minimum distance 212 between the contour 209 and the contour 210 may represent the Approx_Bridge_CD of Equation (1) above, and may be a sum of the corner-to-corner distance 214 (e.g., the distance from the corner 206 to the corner 208), the distance 216 from the corner 206 to the contour 209 (e.g., using a line connecting the corners and extending the line to the contour 209), and the distance 218 from the corner 208 to the contour 210 (e.g., using the line connecting the corners and extending the line to the contour 210).

Still referring to FIG. 1, the line connecting the corners and extending the line to the contour 210 may be referred to as CR2_Bridge 220 from Equation (1) above. Another line using an angle of 45 degrees with respect to the X-axis may be referred to as CR2 222, and may be used to generate CR2_Bridge 220 based on the equation CR_Bridge=CR*Cos(ϕ). The line connecting the corners and extending the line to the contour 209 may be referred to as CR1_Bridge 230 from Equation (1) above. Another line using an angle of 45 degrees with respect to the X-axis may be referred to as CR1 232, and may be used to generate CR1_Bridge 230 based on the equation CR_Bridge=CR*Cos(ϕ). To generate ϕ, the X- and Y-coordinates of the vertex 1 (e.g., the polygon 202) and the vertex 2 (e.g., polygon 204), as represented by the corner 206 and the corner 208, respectively, may be used in the equation $$\phi = \tan^{-1}\left(\frac{(Vertex2.y - Vertex1.y)}{(Vertex2.x - Vertex1.x)}\right),$$

where Vertex1.x is the X-coordinate of the corner 206, Vertex2.x is the X-coordinate of the corner 208, Vertex1.y is the Y-coordinate of the corner 206, and Vertex2.y is the Y-coordinate of the corner 208 (e.g., a triangle formed using the corner 206 and the corner 208, in which the hypotenuse is the line connecting the corner 206 and the corner 208). To generate CR1 232 and CR2 222, an approximation may be used for the 45 degree angle. For example, the following equation may generate CR: CR=min(min(1.6,2.2+0.1*min (a, b)−0.01*(min(a, b)−15.7)²,4.05), where the scalar values may be selected for approximation, and the values of a and b may be different for the respective polygon (e.g., CR1 232 for the polygon 202 may be based on a1 and b1 as shown in FIG. 2, and CR2 222 for the polygon 204 may be based on a2 and b2 as shown). Once $\phi$ and CR1 232 are generated, CR1_Bridge 230 may be generated as CR1_Bridge 230=CR1 232\*Cos($\phi$). Once $\phi$ and CR2 222 are generated, CR2_Bridge 220 may be generated as CR2_Bridge 220=CR2 222\*Cos($\phi$). Once CR1_Bridge 230 and CR2_Bridge 220 are generated along with the corner-to-corner distance 214, the minimum distance 212 may be generated to represent Approx_Bridge_CD using Equation (1).

FIG. 3 illustrates a Bezier curve parameterization 300 for heuristic photomask contour prediction for generating a photomask using enhanced optical proximity corrections, in accordance with one or more example embodiments of the present disclosure.

Referring to FIG. 3, a polygon 302 with corners 304, 306, 308, and 309 may use a contour 310 to generate an integrated circuit photomask. The contour 310 may be based on coordinates selected from groups of coordinates 311, 312, 314, 316, 318, 320, 322, 324, 326, 328, 330, 332, 334, and 336, and may not align completely with the polygon 302 and its corners. In FIG. 2, an example of solution (2) above is shown for fast heuristic mask corner rounding based on creating a Bezier-curve based mask contour approximation with the contour 310. Such an approximation would also first be fit to a reliable MPC model over the parameter space of the geometric properties of the two edges comprising a given corner of the mask before OPC, dependent on the specific mask process to be used. Then during OPC a Bezier curve approximation to the MPC contour bridge CD can be calculated quickly using published fast algorithms for determining the closest approach of two Bezier curves. Constraints used to generate the contour 310 may include r as a maximum corner rounding (e.g., from the corner 306 to the end of the corner rounding as shown) for one corner, and $\theta$ as an angle formed by an edge of the polygon 302 used to form the corner 306 (in one example) and a line tangent to where the contour 310 intersects with the edge. When an edge length is less than 2 r, for example, a shared control point may be placed in the center of the edge as a constraint.

FIG. 4 illustrates a Bezier curve parameterization 400 for heuristic photomask contour prediction for generating a photomask using enhanced optical proximity corrections, in accordance with one or more example embodiments of the present disclosure.

FIG. 4 shows that the contour-to-contour distance of FIG. 2 does not have to go through a polygon corner for an IC mask. A polygon 402 and a polygon 404 may have corners. Polygon 402 may have a contour 406 formed by a first edge a2 of the polygon 404 and a second edge b2 of the polygon 404, and polygon 404 may have a contour 408 formed by a first edge a1 and a second edge b1 of the polygon 404. The minimum distance 410 between the contour 406 and the contour 408 does not need to depend on the corner-to-corner distance like in solution (1) above as shown in FIG. 2.

Referring to FIG. 3 and FIG. 4, to determine the minimum distance between any two Bezier curves (e.g., representing the contours shown in FIG. 3 and FIG. 4), an algorithm may estimate a lower bound of a minimum distance between two nodes, estimate an upper bound of the minimum distance, and perform node subdivision. The algorithm may include determining if an upper bound of two nodes (e.g., one node of the contour 406 and one node of the contour 408) is less than or equal to a global upper bound minimum distance, then a new value of the global upper bound minimum distance is set to the upper bound of the two nodes. If the upper bound of the two nodes is greater than or equal to the global upper bound minimum distance multiplied by (1—a tolerance), then the global upper bound minimum distance remains as it was. Otherwise, the first node is subdivided into two first nodes, the second node is subdivided into two second nodes, and the global upper bound minimum distance may be set to the minimum of the global upper bound minimum distance and the algorithm applied to respective subdivided portions of the two nodes and the global upper bound minimum distance. In this manner, the global upper bound minimum distance is maintained and converges to an actual minimum distance between the MPC contours.

FIG. 5 illustrates a flow diagram of an illustrative process 500 for generating a photomask using enhanced optical proximity corrections, in accordance with one or more example embodiments of the present disclosure.

At block 502, a device (e.g., the OPC device 619 of FIG. 6) may identify a first MPC contour (e.g., the contour 209 of FIG. 1, the contour 406 of FIG. 4) for a first polygon of an IC. The first contour may be based on the selected photomask for the first polygon, and during OPC may be adjusted. The first polygon may have a corner formed by segments in the X- and Y-axis directions. The first contour may have a rounded edge that does not intersect with the corner.

At block 504, the device may identify a second MPC contour (e.g., the contour 210 of FIG. 2, the contour 408 of FIG. 4) for a second polygon of the IC. The second contour may be based on the selected photomask for the second polygon, and during OPC may be adjusted. The second polygon may have a corner formed by segments in the X- and Y-axis directions. The second contour may have a rounded edge that does not intersect with the corner.

At block 506, the device may generate a fast contour prediction based on corner rounding associated with the first and second MPC contours. Using solution (1) according to the example of FIG. 2, the minimum distance between the contours may be predicted as the fast contour prediction by adding the distance between the polygon corners to respective estimated distances from the corners to the respective polygon contours. Using solution (2) according to the example of FIG. 4, the contours may be represented by Bezier curves, and the minimum distance between Bezier curves may be estimated using the algorithm described with respect to FIG. 4. At block 508, the device may generate, based on the fast contour prediction, the minimum distance between the two contours. Based on the minimum distance, the photomasks may be adjusted, allowing for the OPC process to adjust the photomasks of the IC to account for corner rounding.

It is understood that the above descriptions are for purposes of illustration and are not meant to be limiting.

Figure 6:
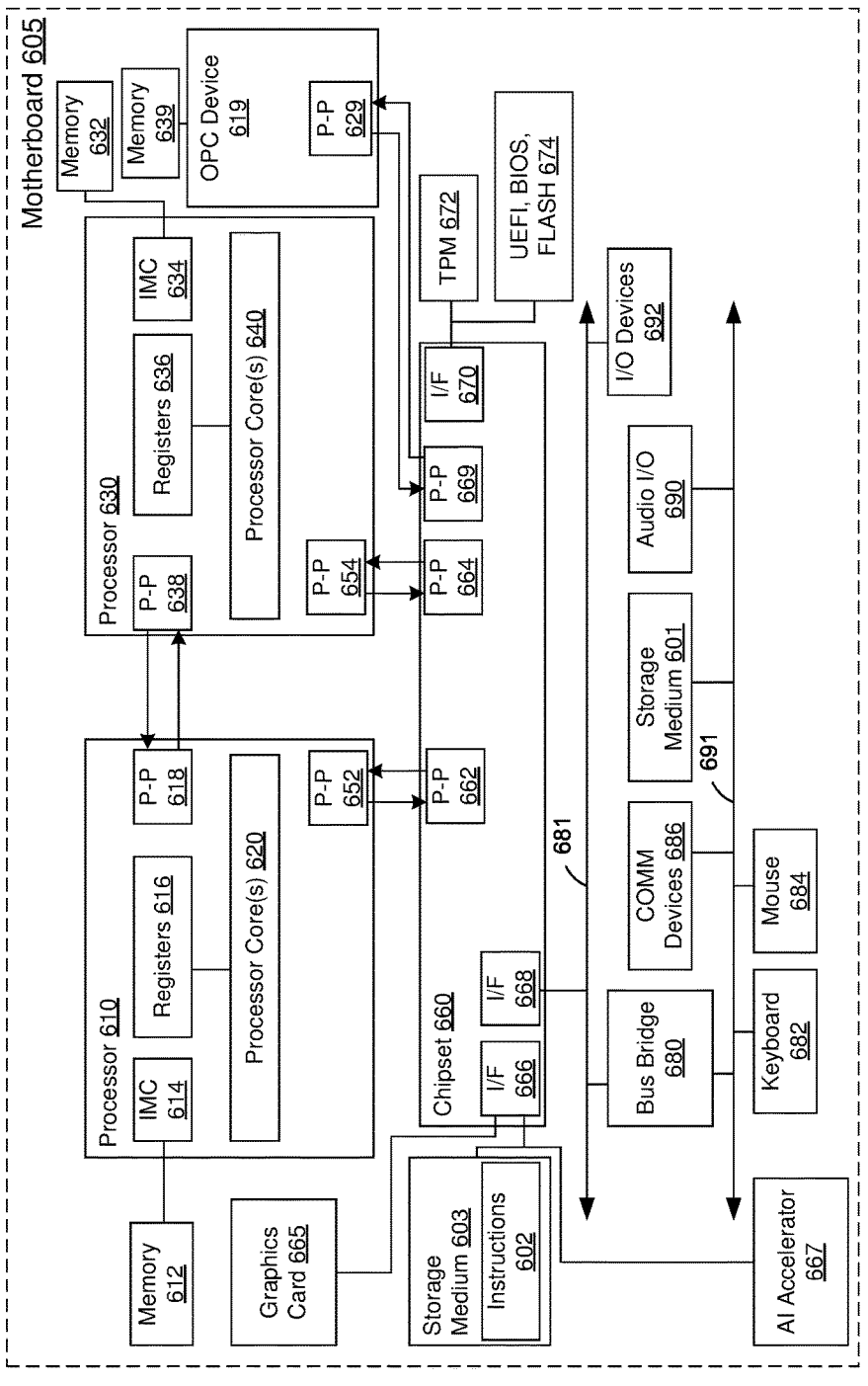
FIG. 6 illustrates an embodiment of an exemplary system, in accordance with one or more example embodiments of the present disclosure.

FIG. 6 illustrates an embodiment of an exemplary system 600, in accordance with one or more example embodiments of the present disclosure.

In various embodiments, the computing system 600 may comprise or be implemented as part of an electronic device.

In some embodiments, the computing system 600 may be representative, for example, of a computer system that implements one or more components and/or performs steps of the processes of FIGS. 1-5.

The embodiments are not limited in this context. More generally, the computing system 600 is configured to implement all logic, systems, processes, logic flows, methods, equations, apparatuses, and functionality described herein and with reference to FIGS. 1-5.

The system 600 may be a computer system with multiple processor cores such as a distributed computing system, supercomputer, high-performance computing system, computing cluster, mainframe computer, mini-computer, client-server system, personal computer (PC), workstation, server, portable computer, laptop computer, tablet computer, a handheld device such as a personal digital assistant (PDA), or other devices for processing, displaying, or transmitting information. Similar embodiments may comprise, e.g., entertainment devices such as a portable music player or a portable video player, a smart phone or other cellular phones, a telephone, a digital video camera, a digital still camera, an external storage device, or the like. Further embodiments implement larger scale server configurations. In other embodiments, the system 600 may have a single processor with one core or more than one processor. Note that the term "processor" refers to a processor with a single core or a processor package with multiple processor cores.

In at least one embodiment, the computing system 600 is configured to implement all logic, systems, processes, logic flows, methods, apparatuses, and functionality described herein with reference to the above figures.

As used in this application, the terms "system" and "component" and "module" are intended to refer to a computer-related entity, either hardware, a combination of hardware and software, software, or software in execution, examples of which are provided by the exemplary system 600. For example, a component can be, but is not limited to being, a process running on a processor, a processor, a hard disk drive, multiple storage drives (of optical and/or magnetic storage medium), an object, an executable, a thread of execution, a program, and/or a computer.

By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

As shown in this figure, system 600 comprises a motherboard 605 for mounting platform components. The motherboard 605 is a point-to-point interconnect platform that includes a processor 610, a processor 630 coupled via a point-to-point interconnects as an Ultra Path Interconnect (UPI), and an OPC device 619 (e.g., capable of performing the functions of FIGS. 1-5). In other embodiments, the system 600 may be of another bus architecture, such as a multi-drop bus. Furthermore, each of processors 610 and 630 may be processor packages with multiple processor cores. As an example, processors 610 and 630 are shown to include processor core(s) 620 and 640, respectively. While the system 600 is an example of a two-socket (2S) platform, other embodiments may include more than two sockets or one socket. For example, some embodiments may include a four-socket (4S) platform or an eight-socket (8S) platform. Each socket is a mount for a processor and may have a socket identifier. Note that the term platform refers to the motherboard with certain components mounted such as the processors 610 and the chipset 660. Some platforms may include additional components and some platforms may only include sockets to mount the processors and/or the chipset.

The processors 610 and 630 can be any of various commercially available processors, including without limitation an Intel® Celeron®, Core®, Core (2) Duo®, Itanium®, Pentium®, Xeon®, and XScale® processors; AMD® Athlon®, Duron® and Opteron® processors; ARM® application, embedded and secure processors; IBM® and Motorola® DragonBall® and PowerPC® processors; IBM and Sony® Cell processors; and similar processors. Dual microprocessors, multi-core processors, and other multi-processor architectures may also be employed as the processors 610, and 630.

The processor 610 includes an integrated memory controller (IMC) 614 and point-to-point (P-P) interfaces 618 and 652. Similarly, the processor 630 includes an IMC 634 and P-P interfaces 638 and 654. The WIC's 614 and 634 couple the processors 610 and 630, respectively, to respective memories, a memory 612 and a memory 632. The memories 612 and 632 may be portions of the main memory (e.g., a dynamic random-access memory (DRAM)) for the platform such as double data rate type 3 (DDR3) or type 4 (DDR4) synchronous DRAM (SDRAM). In the present embodiment, the memories 612 and 632 locally attach to the respective processors 610 and 630.

In addition to the processors 610 and 630, the system 600 may include the OPC device 619. The OPC device 619 may be connected to chipset 660 by means of P-P interfaces 629 and 669. The OPC device 619 may also be connected to a memory 639. In some embodiments, the OPC device 619 may be connected to at least one of the processors 610 and 630. In other embodiments, the memories 612, 632, and 639 may couple with the processor 610 and 630, and the OPC device 619 via a bus and shared memory hub.

System 600 includes chipset 660 coupled to processors 610 and 630. Furthermore, chipset 660 can be coupled to storage medium 603, for example, via an interface (UF) 666. The I/F 666 may be, for example, a Peripheral Component Interconnect-enhanced (PCI-e). The processors 610, 630, and the OPC device 619 may access the storage medium 603 through chipset 660.

Storage medium 603 may comprise any non-transitory computer-readable storage medium or machine-readable storage medium, such as an optical, magnetic or semiconductor storage medium. In various embodiments, storage medium 603 may comprise an article of manufacture. In some embodiments, storage medium 603 may store computer-executable instructions, such as computer-executable instructions 602 to implement one or more of processes or operations described herein, (e.g., process 500 of FIG. 5). The storage medium 603 may store computer-executable instructions for any equations depicted above. The storage medium 603 may further store computer-executable instructions for models and/or networks described herein, such as a neural network or the like. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable types of code, such as source code, compiled code, interpreted code, executable code, static code, dynamic code, object-oriented code, visual code, and the like. It should be understood that the embodiments are not limited in this context.

The processor 610 couples to a chipset 660 via P-P interfaces 652 and 662 and the processor 630 couples to a chipset 660 via P-P interfaces 654 and 664. Direct Media Interfaces (DMIs) may couple the P-P interfaces 652 and 662 and the P-P interfaces 654 and 664, respectively. The DMI may be a high-speed interconnect that facilitates, e.g., eight Giga Transfers per second (GT/s) such as DMI 3.0. In other embodiments, the processors 610 and 630 may interconnect via a bus.

The chipset 660 may comprise a controller hub such as a platform controller hub (PCH). The chipset 660 may include a system clock to perform clocking functions and include interfaces for an I/O bus such as a universal serial bus (USB), peripheral component interconnects (PCIs), serial peripheral interconnects (SPIs), integrated interconnects (I2Cs), and the like, to facilitate connection of peripheral devices on the platform. In other embodiments, the chipset 660 may comprise more than one controller hub such as a chipset with a memory controller hub, a graphics controller hub, and an input/output (I/O) controller hub.

In the present embodiment, the chipset 660 couples with a trusted platform module (TPM) 672 and the UEFI, BIOS, Flash component 674 via an interface (UF) 670. The TPM 672 is a dedicated microcontroller designed to secure hardware by integrating cryptographic keys into devices. The UEFI, BIOS, Flash component 674 may provide pre-boot code.

Furthermore, chipset 660 includes the I/F 666 to couple chipset 660 with a high-performance graphics engine, graphics card 665. In other embodiments, the system 600 may include a flexible display interface (FDI) between the processors 610 and 630 and the chipset 660. The FDI interconnects a graphics processor core in a processor with the chipset 660.

Various I/O devices 692 couple to the bus 681, along with a bus bridge 680 which couples the bus 681 to a second bus 691 and an I/F 668 that connects the bus 681 with the chipset 660. In one embodiment, the second bus 691 may be a low pin count (LPC) bus. Various devices may couple to the second bus 691 including, for example, a keyboard 682, a mouse 684, communication devices 686, a storage medium 601, and an audio I/O 690 (e.g., including one or more microphones).

The artificial intelligence (AI) accelerator 667 may be circuitry arranged to perform computations related to AI. The AI accelerator 667 may be connected to storage medium 603 and chipset 660. The AI accelerator 667 may deliver the processing power and energy efficiency needed to enable abundant-data computing. The AI accelerator 667 is a class of specialized hardware accelerators or computer systems designed to accelerate artificial intelligence and machine learning applications, including artificial neural networks and machine vision. The AI accelerator 667 may be applicable to algorithms for robotics, internet of things, other data-intensive and/or sensor-driven tasks.

Many of the I/O devices 692, communication devices 686, and the storage medium 601 may reside on the motherboard 605 while the keyboard 682 and the mouse 684 may be add-on peripherals. In other embodiments, some or all the I/O devices 692, communication devices 686, and the storage medium 601 are add-on peripherals and do not reside on the motherboard 605.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution. The term "code" covers a broad range of software components and constructs, including applications, drivers, processes, routines, methods, modules, firmware, microcode, and subprograms. Thus, the term "code" may be used to refer to any collection of instructions that, when executed by a processing system, perform a desired operation or operations.

Logic circuitry, devices, and interfaces herein described may perform functions implemented in hardware and implemented with code executed on one or more processors. Logic circuitry refers to the hardware or the hardware and code that implements one or more logical functions. Circuitry is hardware and may refer to one or more circuits. Each circuit may perform a particular function. A circuit of the circuitry may comprise discrete electrical components interconnected with one or more conductors, an integrated circuit, a chip package, a chipset, memory, or the like. Integrated circuits include circuits created on a substrate such as a silicon wafer and may comprise components. Integrated circuits, processor packages, chip packages, and chipsets may comprise one or more processors.

Processors may receive signals such as instructions and/or data at the input(s) and process the signals to generate at least one output. While executing code, the code changes the physical states and characteristics of transistors that make up a processor pipeline. The physical states of the transistors translate into logical bits of ones and zeros stored in registers within the processor. The processor can transfer the physical states of the transistors into registers and transfer the physical states of the transistors to another storage medium.

A processor may comprise circuits to perform one or more sub-functions implemented to perform the overall function of the processor. One example of a processor is a state machine or an application-specific integrated circuit (ASIC) that includes at least one input and at least one output. A state machine may manipulate the at least one input to generate the at least one output by performing a predetermined series of serial and/or parallel manipulations or transformations on the at least one input.

The logic as described above may be part of the design for an integrated circuit chip. The chip design is created in a graphical computer programming language, and stored in a computer storage medium or data storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a processor board, a server platform, or a motherboard, or (b) an end product.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

The following examples pertain to further embodiments.

Example 1 may include a method for optical proximity corrections to an integrated circuit photomask, the method comprising: identifying, by processing circuitry of a device, a first contour of a first adjacent polygon of a first photomask predicted for a first polygon of an integrated circuit, the first contour excluding a first corner formed by a first edge and a second edge of the first polygon; identifying, by the processing circuitry, a second contour of a second adjacent polygon of a second photomask predicted for a second polygon of the integrated circuit, the second contour excluding a second corner formed by a third edge and a fourth edge of the second polygon; generating, by the processing circuitry, a fast contour prediction based on corner rounding associated with the first contour and the second contour; and generating, by the processing circuitry, based on the fast contour prediction, a minimum distance between the first contour and the second contour, the minimum distance associated with the optical proximity corrections to the integrated circuit photomask.

Example 2 may include the method of example 1, further comprising: determining a first distance between the first corner and the second corner; determining a second distance between the first corner and the first contour; and determining a third distance between the second corner and the second contour, wherein the minimum distance is based on the first distance, the second distance, and the third distance.

Example 3 may include the method of example 2, wherein the minimum distance is based on a sum of the first distance, the second distance, and the third distance.

Example 4 may include the method of example 3, further comprising: generating an angle with respect to a horizontal axis based on a line between the first corner and the second corner, wherein the minimum distance is further based on the angle.

Example 5 may include the method of example 4, wherein the first distance and the second distance are based on the angle.

Example 6 may include the method of example 5, wherein the first distance is further based on a minimum value of the first edge and the second edge, and wherein the second distance is further based on a minimum value of the third edge and the fourth edge.

Example 7 may include the method of example 1, wherein the first contour is a first Bezier curve, and wherein the second contour is a second Bezier curve.

Example 8 may include the method of example 7, wherein the minimum distance is not based on the first corner or the second corner.

Example 9 may include a non-transitory computer-readable storage medium comprising instructions to cause processing circuitry of a device for optical proximity corrections to an integrated circuit photomask, upon execution of the instructions by the processing circuitry, to: identify a first contour of a first adjacent polygon of a photomask predicted for a first polygon of an integrated circuit, the first contour excluding a first corner formed by a first edge and a second edge of the first polygon; identify a second contour of a second adjacent polygon of a second photomask predicted for a second polygon of the integrated circuit, the second contour excluding a second corner formed by a third edge and a fourth edge of the second polygon; generate a fast contour prediction based on corner rounding associated with the first contour and the second contour; and generate, based on the fast contour prediction, a minimum distance between the first contour and the second contour, the minimum distance associated with the optical proximity corrections to the integrated circuit photomask.

Example 10 may include the non-transitory computer-readable medium of example 9, wherein execution of the instructions further causes the processing circuitry to: determine a first distance between the first corner and the second corner; determine a second distance between the first corner and the first contour; and determine a third distance between the second corner and the second contour, wherein the minimum distance is based on the first distance, the second distance, and the third distance.

Example 11 may include the non-transitory computer-readable medium of example 10, wherein the minimum distance is based on a sum of the first distance, the second distance, and the third distance.

Example 12 may include the non-transitory computer-readable medium of example 11, wherein execution of the instructions further causes the processing circuitry to: generate an angle with respect to a horizontal axis based on a line between the first corner and the second corner, wherein the minimum distance is further based on the angle.

Example 13 may include the non-transitory computer-readable medium of example 9, wherein the first contour is a first Bezier curve, and wherein the second contour is a second Bezier curve.

Example 14 may include the non-transitory computer-readable medium of example 13, wherein the minimum distance is not based on the first corner or the second corner.

Example 15 may include an apparatus of a device for optical proximity corrections to an integrated circuit photomask, the apparatus comprising memory coupled to processing circuitry, wherein the processing circuitry is configured to: identify a first contour of a first adjacent polygon in a first photomask predicted for a first polygon of an integrated circuit, the first contour excluding a first corner formed by a first edge and a second edge of the first polygon; identify a second contour of a second adjacent polygon in a second photomask predicted for a second polygon of the integrated circuit, the second contour excluding a second corner formed by a third edge and a fourth edge of the second polygon; generate a fast contour prediction based on corner rounding associated with the first contour and the second contour; and generate, based on the fast contour prediction, a minimum distance between the first contour and the second contour, the minimum distance associated with the optical proximity corrections to the integrated circuit photomask.

Example 16 may include the apparatus of example 15, wherein the processing circuitry is further configured to: determine a first distance between the first corner and the second corner; determine a second distance between the first corner and the first contour; and determine a third distance between the second corner and the second contour, wherein the minimum distance is based on the first distance, the second distance, and the third distance.

Example 17 may include the apparatus of example 16, wherein the minimum distance is based on a sum of the first distance, the second distance, and the third distance.

Example 18 may include the apparatus of example 17, wherein the processing circuitry is further configured to: generate an angle with respect to a horizontal axis based on a line between the first corner and the second corner, wherein the minimum distance is further based on the angle.

Example 19 may include the apparatus of example 15, wherein the first contour is a first Bezier curve, and wherein the second contour is a second Bezier curve.

Example 20 may the apparatus of example 19, wherein the minimum distance is not based on the first corner or the second corner.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A method for optical proximity corrections to an integrated circuit photomask, the method comprising:

identifying, by processing circuitry of a device, a first contour of a first adjacent polygon of a photomask predicted for a first polygon of an integrated circuit and for a second polygon of the integrated circuit, the first contour excluding a first corner formed by a first edge and a second edge of the first polygon;

identifying, by the processing circuitry, a second contour of a second adjacent polygon of the photomask, the second contour excluding a second corner formed by a third edge and a fourth edge of the second polygon;

identifying geometric parameters comprising lengths of mask segments forming the first corner and the second corner;

generating, by the processing circuitry, a fast contour prediction using a pre-calibrated heuristic function that calculates approximate mask corner rounding based on the identified geometric parameters, wherein the pre-calibrated heuristic function is fitted to a mask process model associated with approximating a closest approach between mask contours; and generating, by the processing circuitry, based on the fast contour prediction, a minimum distance between the first contour and the second contour, the minimum distance associated with the optical proximity corrections to the integrated circuit photomask.

2. The method of claim 1, further comprising:

determining a first distance between the first corner and the second corner;

determining a second distance between the first corner and the first contour; and determining a third distance between the second corner and the second contour, wherein the minimum distance is based on the first distance, the second distance, and the third distance.

3. The method of claim 2, wherein the minimum distance is based on a sum of the first distance, the second distance, and the third distance.

4. The method of claim 3, further comprising:

generating an angle with respect to a horizontal axis based on a line between the first corner and the second corner, wherein the minimum distance is further based on the angle.

5. The method of claim 4, wherein the first distance and the second distance are based on the angle.

6. The method of claim 5, wherein the first distance is further based on a minimum value of the first edge and the second edge, and wherein the second distance is further based on a minimum value of the third edge and the fourth edge.

7. The method of claim 1, wherein the first contour is a first Bezier curve, and wherein the second contour is a second Bezier curve.

8. The method of claim 7, wherein the minimum distance is not based on the first corner or the second corner.

9. A non-transitory computer-readable storage medium comprising instructions to cause processing circuitry of a device for optical proximity corrections to an integrated circuit photomask, upon execution of the instructions by the processing circuitry, to:

identify a first contour of a first adjacent polygon of a photomask predicted for a first polygon of an integrated circuit and for a second polygon of the integrated circuit, the first contour excluding a first corner formed by a first edge and a second edge of the first polygon;

identify a second contour of a second adjacent polygon of the photomask, the second contour excluding a second corner formed by a third edge and a fourth edge of the second polygon;

identify geometric parameters comprising lengths of mask segments forming the first corner and the second corner;

generate a fast contour prediction using a pre-calibrated heuristic function that calculates approximate mask corner rounding based on the identified geometric parameters, wherein the pre-calibrated heuristic function is fitted to a mask process model associated with approximating a closest approach between mask contours; and generate, based on the fast contour prediction, a minimum distance between the first contour and the second contour, the minimum distance associated with the optical proximity corrections to the integrated circuit photomask.

10. The non-transitory computer-readable medium of claim 9, wherein execution of the instructions further causes the processing circuitry to:

determine a first distance between the first corner and the second corner;

determine a second distance between the first corner and the first contour; and determine a third distance between the second corner and the second contour, wherein the minimum distance is based on the first distance, the second distance, and the third distance.

11. The non-transitory computer-readable medium of claim 10, wherein the minimum distance is based on a sum of the first distance, the second distance, and the third distance.

12. The non-transitory computer-readable medium of claim 11, wherein execution of the instructions further causes the processing circuitry to:

generate an angle with respect to a horizontal axis based on a line between the first corner and the second corner, wherein the minimum distance is further based on the angle.

13. The non-transitory computer-readable medium of claim 9, wherein the first contour is a first Bezier curve, and wherein the second contour is a second Bezier curve.

14. The non-transitory computer-readable medium of claim 13, wherein the minimum distance is not based on the first corner or the second corner.

15. An apparatus of a device for optical proximity corrections to an integrated circuit photomask, the apparatus comprising memory coupled to processing circuitry, wherein the processing circuitry is configured to:

identify a first contour of a first adjacent polygon in a photomask predicted for a first polygon of an integrated circuit and for a second polygon of the integrated circuit, the first contour excluding a first corner formed by a first edge and a second edge of the first polygon;

identify a second contour of a second adjacent polygon in the photomask, the second contour excluding a second corner formed by a third edge and a fourth edge of the second polygon;

identify geometric parameters comprising lengths of mask segments forming the first corner and the second corner;

generate a fast contour prediction using a pre-calibrated heuristic function that calculates approximate mask corner rounding based on the identified geogmetric parameters, wherein the pre-calibrated heuristic function is fitted to a mask process model associated with approximating a closest approach between mask contours; and generate, based on the fast contour prediction, a minimum distance between the first contour and the second contour, the minimum distance associated with the optical proximity corrections to the integrated circuit photomask.

16. The apparatus of claim 15, wherein the processing circuitry is further configured to:

determine a first distance between the first corner and the second corner;

determine a second distance between the first corner and the first contour; and determine a third distance between the second corner and the second contour, wherein the minimum distance is based on the first distance, the second distance, and the third distance.

17. The apparatus of claim 16, wherein the minimum distance is based on a sum of the first distance, the second distance, and the third distance.

18. The apparatus of claim 17, wherein the processing circuitry is further configured to:

generate an angle with respect to a horizontal axis based on a line between the first corner and the second corner, wherein the minimum distance is further based on the angle.

19. The apparatus of claim 15, wherein the first contour is a first Bezier curve, and wherein the second contour is a second Bezier curve.

20. The apparatus of claim 19, wherein the minimum distance is not based on the first corner or the second corner.

* * * * *